(12) United States Patent
Standing

(10) Patent No.: US 10,074,616 B2
(45) Date of Patent: Sep. 11, 2018

(54) CHIP PROTECTION ENVELOPE AND METHOD

(71) Applicant: Infineon Technologies Austria AG, Villach (AT)

(72) Inventor: Martin Standing, Villach (AT)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 0 days.

(21) Appl. No.: 15/343,041

(22) Filed: Nov. 3, 2016

(65) Prior Publication Data

US 2017/0154856 A1 Jun. 1, 2017

(30) Foreign Application Priority Data

Nov. 30, 2015 (DE) .......... 10 2015 120 745

(51) Int. Cl.
| | |
|---|---|
| *H01L 23/00* | (2006.01) |
| *H01L 23/31* | (2006.01) |
| *H01L 29/78* | (2006.01) |
| *H01L 23/051* | (2006.01) |

(52) U.S. Cl.
CPC .......... *H01L 23/562* (2013.01); *H01L 23/051* (2013.01); *H01L 23/3107* (2013.01); *H01L 23/3114* (2013.01); *H01L 23/3135* (2013.01); *H01L 23/3157* (2013.01); *H01L 24/27* (2013.01); *H01L 24/30* (2013.01); *H01L 29/7827* (2013.01); *H01L 2224/28105* (2013.01); *H01L 2224/29005* (2013.01)

(58) Field of Classification Search
CPC ............... H01L 23/562; H01L 23/3157; H01L 23/3135; H01L 2224/28105
See application file for complete search history.

(56) References Cited

U.S. PATENT DOCUMENTS

| | | | |
|---|---|---|---|
| 2012/0153509 A1* | 6/2012 | Kyozuka | H01L 23/3157 257/784 |
| 2012/0286408 A1* | 11/2012 | Warren | H01L 21/4832 257/673 |
| 2014/0327071 A1 | 11/2014 | Fuergut et al. | |
| 2015/0243575 A1* | 8/2015 | Strothmann | H01L 23/3114 257/773 |
| 2015/0259194 A1 | 9/2015 | Lin et al. | |

* cited by examiner

*Primary Examiner* — Joseph C Nicely
*Assistant Examiner* — Wilner Jean Baptiste
(74) *Attorney, Agent, or Firm* — Slater Matsil, LLP

(57) ABSTRACT

In an embodiment, a chip protection envelope includes a first dielectric layer including at least one organic component having a decomposition temperature of at least 180° C., a semiconductor die embedded in the first dielectric layer, the semiconductor die having a first surface and a thickness $t_1$. A second dielectric layer is arranged on a first surface of the first dielectric layer, the second dielectric layer including a photodefinable polymer composition, and a conductive layer is arranged on the first surface of the semiconductor die and is electrically coupled to the semiconductor die. The conductive layer has a thickness $t_2$, wherein $t_2 \geq t_1/3$.

26 Claims, 7 Drawing Sheets

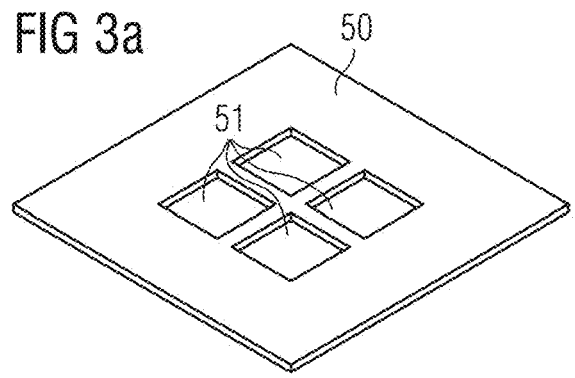
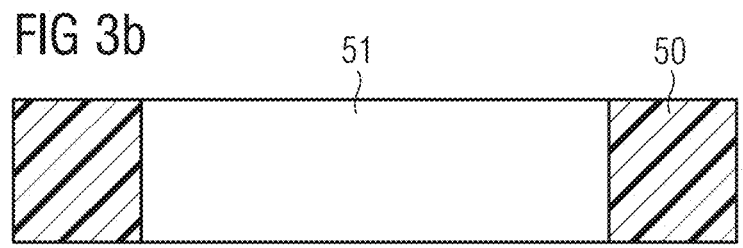
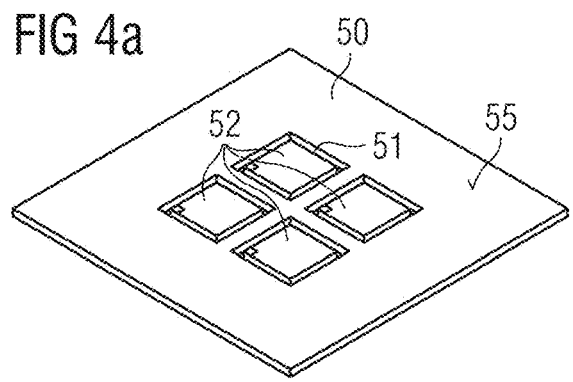
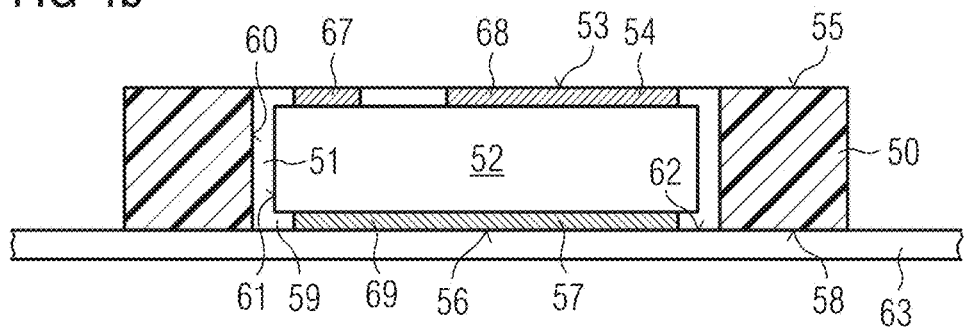

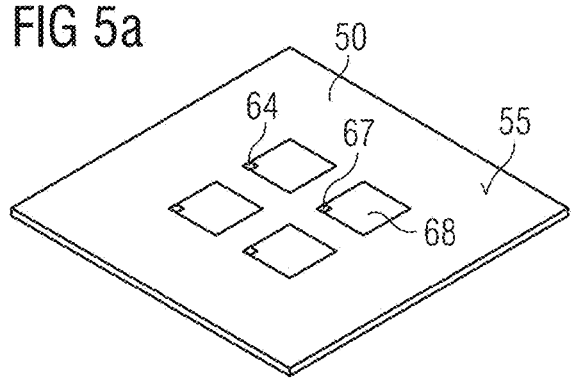
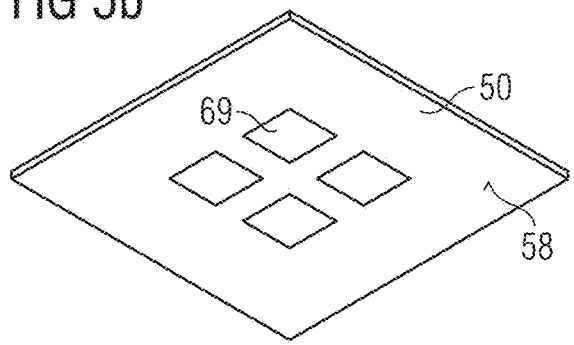
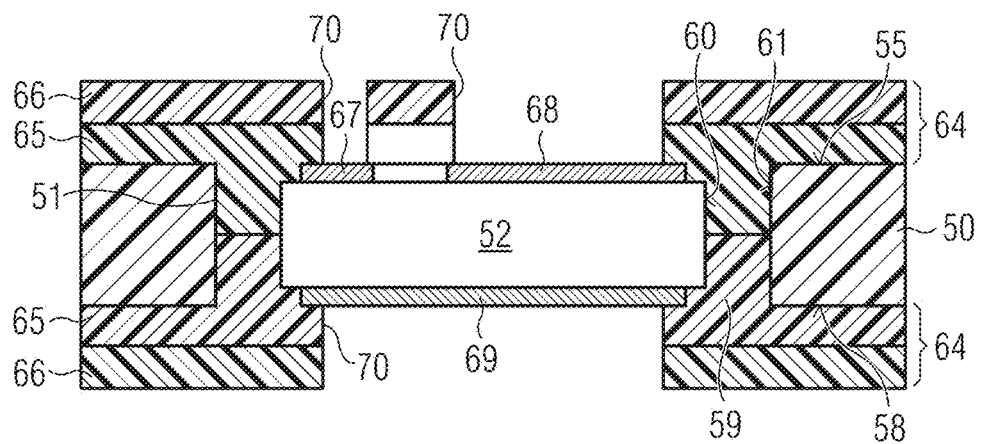

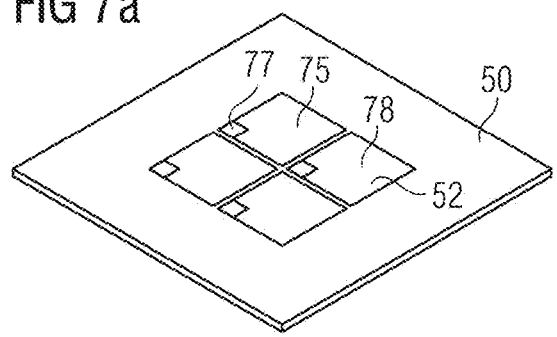
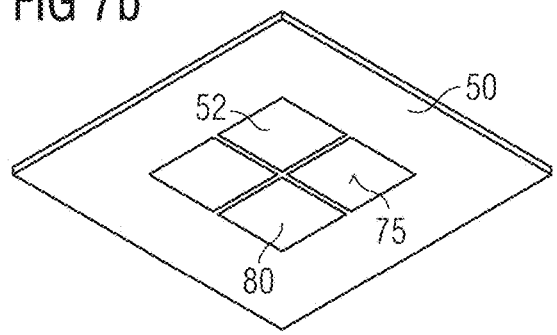
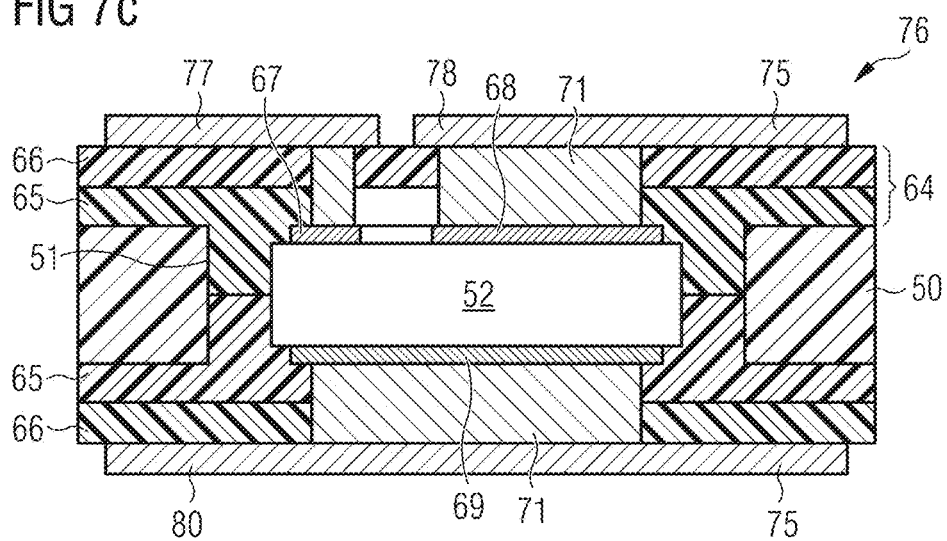

CHIP PROTECTION ENVELOPE AND METHOD

CROSS-REFERENCE TO RELATED APPLICATIONS

This application claims the benefit of German patent application 102015120745.1, filed on Nov. 30, 2015, which application is hereby incorporated herein by reference in its entirety.

BACKGROUND

An electronic component may include one or more semiconductor devices in a package. The package includes internal electrical connections from the semiconductor device to a substrate or a leadframe which includes outer contacts. The outer contacts are used to mount the electronic component on a redistribution board, such as a printed circuit board. The package may include a housing which covers the semiconductor device and the internal electrical connections. The housing may include a plastic material, such as epoxy resin, and may be formed by a mold process, such as injection molding.

Instead of mounting a package including one or more semiconductor devices on an outer surface of a printed circuit board (PCB), the semiconductor device may be embedded within the printed circuit board itself. A printed circuit board may include one or more dielectric layers including, for example, woven glass fibres impregnated with a polymer such as an epoxy resin, and one or more structured conductive layers, for example copper foil, providing a conductive redistribution structure. A semiconductor device may be embedded within the printed circuit board by laminating one or more layers of the printed circuit board onto opposing sides of semiconductor device. The electrical connections between semiconductor device and the redistribution structure of the printed circuit board may be provided by inserting vias through the dielectric layers of the printed circuit board to expose a contact region of the semiconductor device and by inserting conductive material into the via.

Methods for reliably embedding semiconductor devices into a printed circuit board are desirable.

SUMMARY

In an embodiment, a chip protection envelope includes a first dielectric layer including at least one organic component having a decomposition temperature of at least 180° C., a semiconductor die embedded in the first dielectric layer, the semiconductor die having a first surface and a thickness $t_1$, a second dielectric layer arranged on a first surface of the first dielectric layer, the second dielectric layer including a photodefinable polymer composition, and a conductive layer arranged on the first surface of the semiconductor die and electrically coupled to the semiconductor die. The conductive layer has a thickness $t_2$, wherein $t_2 \geq t_1/3$.

In an embodiment, a chip protection envelope includes a support layer including a polymer, a transistor device embedded in the support layer, a passivation layer arranged on the support layer and on at least portions of the transistor device, the passivation layer including a polymer, and a conductive layer arranged on the passivation layer and electrically coupled to the transistor device. A ratio of a lateral area of the transistor device to a lateral area of the chip protection envelope is 1:1.05 to 1:1.5.

In an embodiment, a chip protection envelope includes means for embedding a semiconductor die, means for passivating at least portions of a surface of the semiconductor die, means for promoting adhesion to a conductive layer and means for electrically coupling the semiconductor die to the conductive layer.

In an embodiment, a method includes embedding a semiconductor die in a first dielectric layer, the semiconductor die having a thickness $t_1$ and the first dielectric layer including at least one organic component having a decomposition temperature of at least 180° C., applying a second dielectric layer to a first surface of the first dielectric layer and a first surface of the semiconductor die, the second dielectric layer including a photodefinable polymer composition, forming at least one opening in the second dielectric layer, at least one opening having a base formed by a first electrode of the semiconductor die, the first electrode having a thickness $t_4$, and applying a conductive material into the openings. The conductive material has a thickness $t_5$, wherein $(t_4+t_5) \, t_1/6$.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 3a illustrates a perspective top view of a core layer of a chip protection envelope;

FIG. 3b illustrates a cross-sectional view of the core layer of the chip protection envelope;

FIG. 4a illustrates a perspective top view of a semiconductor die inserted in an aperture in the core layer of the chip protection envelope;

FIG. 4b illustrates a cross-sectional view of the semiconductor die inserted in the aperture of the core layer of the chip protection envelope;

FIG. 5a illustrates a perspective top view of a dielectric layer applied to the semiconductor die and the core layer;

FIG. 5b illustrates a perspective bottom view of the dielectric layer applied to the semiconductor die and the core layer;

FIG. 5c illustrates a cross-sectional view of the dielectric layer applied to the semiconductor die and the core layer;

FIG. 7a illustrates a perspective top view of a second conductive layer applied to the semiconductor die and the dielectric layer;

FIG. 7b illustrates a perspective bottom view of the second conductive layer applied to the semiconductor die and the dielectric layer;

FIG. 7c illustrates a cross-sectional view of the second conductive layer applied to the semiconductor die and the dielectric layer;

DETAILED DESCRIPTION OF ILLUSTRATIVE EMBODIMENTS

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, the terms "coupled" and/or "electrically coupled" are not meant to mean that the elements must be directly coupled together-intervening elements may be provided between the "coupled" or "electrically coupled" elements.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
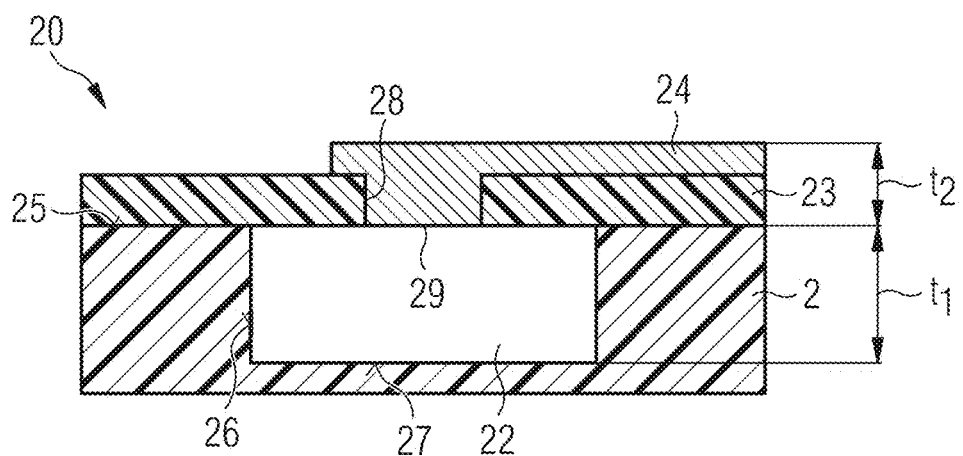
FIG. 1 illustrates a chip protection envelope according to a first embodiment.

FIG. 1 illustrates a chip protection envelope 20 according to a first embodiment. The chip protection envelope 20 includes a first dielectric layer 21, a semiconductor chip or die 22, a second dielectric layer 23 and a conductive layer 24. The semiconductor die 22 is embedded in the first dielectric layer 21. The second dielectric layer 23 is arranged on a first surface 25 of the first dielectric layer 21 and the conductive layer 24 is arranged on and electrically coupled to the semiconductor die 22.

The semiconductor die 22 has a thickness $t_1$ and the conductive layer 24 has a thickness $t_2$. The ratio of the thickness of the conductive layer $t_2$ to the thickness of the semiconductor die $t_1$ may be at least one third or in an alternative nomenclature $t_2 \geq t_1/3$.

The conductive layer 24 is also arranged on the second dielectric layer 23 and may have a thickness of at least 5 µm in regions positioned on the second dielectric layer 21. The conductive layer 24 may include a metal, such as copper or an alloy.

The semiconductor die 22 may have a thickness $t_1$ which is in the range of 40 µm to 100 µm. Semiconductor dies of such a thickness may benefit from the extra mechanical support provided by the first dielectric layer 21, the second dielectric layer 23 and the conductive layer 24 of the chip protection envelope 20 during handling, for example during transport and/or during embedding within a higher level circuit board. During embedding in a circuit board, the device to be embedded may be subjected to heat and pressure if circuit board manufacturing techniques are used. The chip protection envelope 20 provides protection for the semiconductor die 22 during this process.

The conductive layer 24 may have a thickness in the range of 15 µm to 70 µm above at least one portion of the semiconductor die 22 provided that $t_2 \geq t_1/3$. This thickness of the conductive layer 24 is relatively large and may be used to provide a robust electrical connection to the semiconductor die 22 during subsequent handling, for example the electrical connection between the conductive layer 24 and the redistribution structure of a higher level circuit board in which the chip protection envelope 20 is embedded.

In some embodiments, the ratio of the lateral area of the semiconductor die 22 to the lateral area of the chip protection envelope 20 lies within the range of 1:1.05 to 1:1.25.

The lateral area of the semiconductor die 22 and of the chip protection envelope 20 is the area of its respective major surface. For example, if the semiconductor die 22 has a length $l_s$, a breadth $b_s$ and a thickness $t_1$, it has a lateral area $a_s = (l_s \times b_s)$. If the chip protection envelope 20 has a length $l_e$, a breadth $b_e$ and a thickness $t_e$, it has a lateral area $a_e = (l_e \times b_e)$ so that $105\% \leq a_e/a_s \leq 125\%$.

The lateral area $a_e$ of the chip protection envelope 20 is between 5% and 25% greater than the lateral area $a_s$ of the semiconductor die 22 so that the increase in the lateral area of the chip protection envelope 20 compared to the semiconductor die 22 is limited to between 5% greater and 25% greater than that of the semiconductor die 22. This is useful in reducing the space required by the chip protection envelope 20 when embedded in a higher level circuit board. The smaller lateral size and smaller thickness of the chip protection envelope 20 in comparison with a fully packaged semiconductor die, such as a semiconductor die in a package conforming to a JEDEC (Joint Electron Device Engineering Council) standard, may be used to reduce the space and volume requirements within an application whilst providing protection of the semiconductor die 22 during handling and during the embedding process.

The semiconductor die 22 may include a power device such as a power transistor device. The semiconductor die 22 may include a vertical device, that is a device with a vertical drift path which includes at least one electrode on two opposing major surfaces. The vertical device may be vertical power transistor device such as a MOSFET (Metal Oxide Semiconductor Field Effect Transistor) or IGBT (Insulated Gate Bipolar Transistor) or a diode.

The semiconductor die 22 may include a silicon-based or a Group III nitride-based semiconductor device, for example.

The chip protection envelope 20 may provide a type of pre-packaging of the semiconductor die 22 which facilitates the embedding of the semiconductor die 22 within a printed circuit board. For example, the first dielectric layer 21 and the second dielectric layer 23 provide edge protection for the semiconductor die 22 such that handling by a pick and place machine is simplified.

The first dielectric layer 21, in which the semiconductor die 22 is embedded, may provide a core layer or support layer which is in contact with at least side faces 26 of the semiconductor die 22. In some embodiments, the rear surface 27 of the semiconductor die 22 is arranged within and covered by the material of the first dielectric layer 21. The first dielectric layer 21 may include at least one organic component which includes decomposition temperature of at least 180° C., or at least 220° C. By having a decomposition temperature of at least 180° C., the first dielectric layer 21 remains mechanically and chemically stable during subsequent processing, for example during application of the second dielectric layer 23 and the conductive layer 24 onto the first dielectric layer 21. The first dielectric layer 21 and the second dielectric layer 23 may include a polymer.

The second dielectric layer 23 is arranged on first surface 25 of the first dielectric layer 21 and may extend from the first dielectric layer 21 onto the semiconductor die 22. The second dielectric layer 23 may be used to secure semiconductor die 22 within the dielectric core layer 21 or may be used in combination with the first dielectric layer 21 to protect the semiconductor die 22 against external mechanical, chemical or environmental sources. The second dielectric layer 23 may include a photodefinable polymer composition, thus enabling the second dielectric layer 23 to be structured using photoimaging techniques.

In some embodiments, at least the outermost surface of the second dielectric layer 23 includes an epoxy-based composite. The epoxy-based composite may include an epoxy-based resin matrix and a filler, such as fibres or particles, to increase the mechanical strength of the epoxy resin. An epoxy-based composite may be used at the outermost surface to increase the adhesion between the second dielectric layer 23 and the overlying conductive layer 24.

The second dielectric layer 23 may be structured to provide openings 28 in which regions 29 of the semiconductor die 22 are exposed. In some embodiments, an electrode of the semiconductor die 22 or a contact pad coupled to an electrode positioned within or on the semiconductor body of the semiconductor die 22 may form the base of an opening 28. Conductive material or portions of the conductive layer 24 may be inserted in the openings 28 and be arranged on portions of the second dielectric layer 23 in order to electrically couple the semiconductor die 22 to the conductive layer 24 arranged on the upper surface of the second dielectric layer 23. The semiconductor die 22 may be entirely encapsulated by combination of the first dielectric layer 21, the second dielectric layer 23 and the conductive layer 24 which provide a protective structure for the semiconductor die 22.

The second dielectric layer 23 may have a thickness of 5 µm to 20 µm. The conductive layer 24 may have a thickness of 5 µm to 70 µm on regions positioned on the second dielectric layer. The second dielectric layer 23 and the conductive layer 24 provide an increased thickness of dielectric material and conductive material, respectively, above the semiconductor material of the semiconductor die 22. Consequently, the surface of the semiconductor die 22 is provided with additional protection in comparison to the bare semiconductor die 22.

The second dielectric layer 23 in combination with the conductive layer 24 increases the thickness of the conductive material arranged on top of the semiconductor die 22. The thickness of the conductive layer 24 in regions arranged on the semiconductor die 22 may be greater than the thickness of the conductive layer 24 in regions arranged on the second dielectric layer 23 since a portion of the conductive layer 24 is arranged in an opening 28 in the second dielectric layer 23 having a base formed by the semiconductor die 22. Above the semiconductor die 22, the conductive layer 24 may have a thickness corresponding to the sum of the thickness of the second dielectric layer 23 and the thickness of the conductive layer 24 in regions adjacent the semiconductor die 22. This increased thickness may be used to simplify the electrical connection between the conductive layer 24 and the redistribution structure of the printed circuit board.

The conductive layer 24 may have a thickness of around 5 µm to 70 µm or 10 µm to 50 µm in regions on the second dielectric layer 23. In regions on the semiconductor die 22, the conductive layer 34 may have a total thickness of 10 µm to 90 µm or 15 µm to 70 µm, if the second dielectric layer has a thickness of 5 µm to 20 µm. The thickness of the metallization provided on the semiconductor die may be 5 µm or less. Consequently, if a region of the conductive layer 24 provides a base of a via inserted into layer of the printed circuit board laminated onto the conductive layer 24, even if a portion of the conductive material 24 is removed by insertion of the via and any subsequent cleaning operations, a portion of the conductive material of the conductive layer 24 remains. This remaining portion of the conductive layer 24 may be more simply and easily electrically coupled to the conductive material inserted into the via in order to electrically couple the semiconductor die 22 within the chip protection envelope 20 to the printed circuit board.

The first dielectric layer 21, the second dielectric layer 23 and the conductive layer 24 may have a lateral extent which is greater than the lateral extent of semiconductor die 22. The chip protection envelope 20 provides a so-called fan-out arrangement such that peripheral areas of the conductive layer 24 are arranged laterally adjacent the semiconductor die 22 and may have a larger size or larger spacing than the contact pad or pads arranged directly on the semiconductor die 22.

The dimensions of the chip protection envelope 20 may also be selected such that one or more predetermined thicknesses for the envelope 20 are provided. For example, it may be desirable that the envelope as an overall thickness corresponding to a thickness of pre-preg layer of a printed circuit board. However, depending on the type of device provided by the semiconductor die 22, the semiconductor die 22 may have different thicknesses. Therefore, semiconductor dies of differing thickness may be provided within an envelope 20 having a standard thickness corresponding to that of a pre-preg layer of a printed circuit board. Consequently, semiconductor dies of differing thicknesses may be more simply embedded within a common layer of the printed circuit board since they are provided in the form of an envelope 20 having a standardized thickness corresponding to the thickness of the pre-preg layer.

The envelope 20 may be provided with a predetermined envelope outline or envelope footprint. Two or more predetermined envelope outlines and/or envelope footprints may be provided to form a set of envelope standards. The envelope outline may have a predetermined lateral size and shape. The envelope footprint may include a predetermined number, size and distribution of contact pads. This may be used to simplify embedding of differing semiconductor dies within a printed circuit board if the semiconductor die is provided in a chip protection envelope 20 having a predetermined envelope outline and/or envelope footprint.

The chip protection envelope 20 may also facilitate testing of the semiconductor die 22 before the chip protection envelope including the semiconductor die 22 is embedded within a printed circuit board, since the chip protection envelope 20 may include contact pads of a greater lateral area than the contact pads of the semiconductor metallization.

The first dielectric layer 21 includes an organic component having a decomposition temperature of at least 180° C., or in some embodiments at least 220° C. In some embodiments, the decomposition temperature lies within the range of 180° C. and 300° C. In some embodiments, the decomposition temperature lies within the range of 220° C. to 300° C.

An organic component is a carbon-containing component with which is predominately covalently bonded. The decomposition temperature is the temperature at which the organic component begins to chemically decompose. Consequently, the organic component can be considered to be chemically stable at temperatures below the decomposition temperature.

In some embodiments, the first dielectric layer 21 includes a curable dielectric material that is substantially fully cured before the second dielectric layer 23 is applied. For example, the first dielectric layer may include a thermosetting polymer, such as an epoxy resin, which is substantially fully cured before application of the second dielectric layer 23.

The first dielectric layer 21 may include a photodefinable polymer composition. The first dielectric layer 21 may be photodefinable polymer composition sufficiently cured so that the first dielectric layer 21 no longer undergoes a substantial cure process by exposure to light. Consequently, the first dielectric layer 21 remains chemically and mechanically stable during the application and photostructuring of the second dielectric layer 23. The first dielectric layer 21 may include a photodefinable polyimide composition. The second dielectric layer 23 may also include a photodefinable polymer composition including polyimide.

A photodefinable polymer composition includes a polymer that changes its structure when exposed to light, for example light in the ultraviolet or visible region of the electromagnetic spectrum. A photodefinable polymer composition may be said to be photosensitive. The structural change results in hardening of the photodefinable polymer composition when it is exposed to this light as a result of cross-linking between polymer chains or polymerisation of the photodefinable polymer composition. Dielectric layers including a photodefinable polymer composition may, in the uncured state, include a mixture of monomers, oligomers, and photoinitiators that conform into a hardened polymeric material after exposure to light. The dielectric layers including a photodefinable polymer composition undergo photo-induced polymerisation to at least partially cure or harden the dielectric layer.

Some dielectric layers including a photodefinable polymer composition, such as dielectric layers including an epoxy resin, may be subjected to a thermal curing treatment in addition to a partial curing treatment performed by exposure to light. Some dielectric layers, such as dielectric layers including acrylate based polymers, may be substantially fully cured using photo-induced polymerisation alone.

The first dielectric layer 21 can be pre-fabricated with one or more apertures for the semiconductor dies and may be considered as a core. The core can also act as a spacer, which is of the same or a similar thickness to the thickness of the die.

In some embodiments, the first dielectric layer 21 may be in a partially cured state at this stage in the manufacturing process so that some cross-linking between the first dielectric layer 21 and the second dielectric layer 23 can be achieved. Methods for producing an uncured or partially cured layer include high viscosity or solid at room temperature resins, thermal B-staging or polyimide material with a photo-reacting amide (or other) species incorporated and a polyimide system that has not be driven to a fully cured state.

In embodiments in which the aperture extends through the entire thickness of the first dielectric layer 21, the first dielectric layer 21 can be mounted on a carrier, such as a heat-release or UV release tape, to allow the dies to be placed and held in the apertures.

With the semiconductor die 22 in the apertures and held on the carrier, a first layer of photo-definable polymer polyimide is deposited onto the first surface of the assembly and dried to form the first dielectric layer 23. The material is exposed and developed and then assembly is removed from the carrier tape. In embodiments in which the aperture extends through the entire thickness of the first dielectric layer 21, this process may be repeated on the opposing side. The entire assembly is thermally cured and may or may not be cured to the complete reaction. If the cure is not completed, there may be some polymerization with the following organic layers which may assist adhesion.

In some embodiments, the chip protection envelope 20 may include a third dielectric layer arranged on the second dielectric layer 23. The third dielectric layer is arranged between the second dielectric layer 23 and the conductive layer 24.

In embodiments including two or more dielectric layers arranged on the semiconductor die 22 and first dielectric layer 21, differing compositions may be used to provide each of the dielectric layers with differing properties. For example, the second dielectric layer 23, which is arranged directly on the first dielectric layer 21 and the semiconductor die 22, may have a composition selected to provide moisture protection for the semiconductor die 22. For example, the second dielectric layer 23 may include a photodefinable polyimide. The third dielectric layer may be positioned on the second dielectric layer 23 and may include a polymer such as an epoxy resin provides better adhesion to a conductive layer such as copper than the material of the second dielectric layer 23. The third dielectric layer may include a material having greater chemical affinity for copper than the material of the second dielectric layer 23, for example.

In some embodiments, the second dielectric layer and the third dielectric layer include a photodefinable polymer or photodefinable polymer composition. The photodefinable polymer may the same or different in the second dielectric layer and the third dielectric layer. If both of the deposited dielectric layers include a photodefinable polymer, a single structuring step to provide the openings 28 exposing portions of the semiconductor die 22 and/or conductive layer 24 arranged on the first surface of first dielectric layer 21 may be used.

The composition of the first dielectric layer 21 may also be selected to provide particular properties. For example, the first dielectric layer 21 may include a composite having a filler and matrix. The filler may be woven glass fibres and the matrix may include an epoxy resin. A composite may be used in embodiments in which it is desired that the first dielectric layer 21 has good mechanical integrity.

The filler may be used to adjust the rheology of the layer before hardening or curing, adjust the Coefficient of Thermal Expansion (CTE) or the heat resistance of the substrate. The filler may also increase the mechanical strength of composite. The filler may have the form of a plurality of fibres, such as glass fibres or carbon fibres, which may be woven and impregnated with a dielectric material, such as a polymer. The filler is not limited to fibres but may include other shapes. For example, the filler may include a plurality of particles which may have a substantially spherical form.

In some embodiments, the first dielectric layer 21 may be provided by a layer of so-called pre-preg which includes partially cured or B-stage resin impregnated woven glass fibres or fully cured resin impregnated woven glass fibres. The resin may be an epoxy resin. The first dielectric layer 21 may include FR4.

The chip protection envelope 20 is an electronic component which provides a pre-package or intermediate protective package for one or more semiconductor chips or dies. The chip protection envelope 20 has properties suitable for reliably embedding the chip protection envelope 20 in a printed circuit board, in particular for embedding the chip protection envelope 20 in a circuit board or using manufacturing techniques typical for the production of circuit boards.

In some embodiments, the conductive layer 24 has a non-contactable surface. A non-contactable surface may be one to which a low resistance contact to another metal is not formed. For example, the outermost surface of the conductive layer 24 may have a roughness which is sufficient to prevent the formation of a low resistance contact to a further metal. This roughness may be provided in order to provide a good mechanical bond to neighbouring layer of the printed circuit board, for example, a layer of pre-preg. The outermost surface of the conductive layer 24 may be mechanically roughened or may be oxidized to create a non-contactable surface which may also have increased surface roughness.

In some embodiments, an electrically non-conductive protection layer may be provided on the conductive layer 24. This additional electrically non-conductive protection layer may be provided to prevent oxidation or corrosion of the underlying conductive layer 24 during storage. The additional non-conductive protection layer may be removed to form contact regions either before the chip protection envelope 20 is embedded in the printed circuit board or after the chip protection envelope 20 is embedded in printed circuit board. For example, the additional protection layer may be removed during formation of vias through outer layers of the printed circuit board to expose portions of the conductive layer 24 at the base of the vias.

The ratio of the lateral area of the semiconductor die 22 to the lateral area of the chip protection envelope 20 may lie within the range of 1:1.05 to 1:1.5. The lateral area is the area of the major surface or largest two-dimensional surface of the semiconductor die 22 and of chip protection envelope 20. In some embodiments, the ratio of the lateral area of the semiconductor die 22 to the lateral area of the chip protection envelope 20 lies within the range of 1:1.05 to 1:1.25.

The semiconductor die may have a lateral area in the range of 0.5 mm$^2$ to 150 mm$^2$. The lateral area of the semiconductor die may depend on the device and application area. For example, a transistor device for use in consumer electronics may have a lateral area in the range of 1 mm$^2$ to 10 mm$^2$ or 1 mm$^2$ to 5 mm$^2$, for example 1 mm$^2$. A transistor device for use in automotive electronics may have a thickness in the range of 7 mm$^2$ to 150 mm$^2$, for example 144 mm$^2$. The lateral area of the chip protection envelope may lie in the range of 0.525 mm$^2$ to 187.5 mm$^2$, 1.05 mm$^2$ to 12.5 mm$^2$ or 1.05 mm$^2$ to 7.25 mm$^2$ and 7.35 mm$^2$ and 187.5 mm$^2$, respectively.

The semiconductor die has a thickness $t_1$. The thickness $t_1$ is the thickness of the semiconductor body excluding any metallisation arranged on the surface.

The ratio between the thickness $t_2$ of the conductive layer 24 arranged on a surface of the semiconductor die 22 and the thickness $t_1$ of the semiconductor die 22 is $t_2 \geq t_1/3$. The upper limit of the ratio between the thickness $t_2$ of the conductive layer 24 arranged on a surface of the semiconductor die 22 and the thickness $t_1$ of the semiconductor die 22 may be 1.5 $t_1$ so that $t_1/3 \leq t_2 \leq 1.5\, t_1$ The thickness $t_1$ may lie in the range of 40 μm to 100 μm, 40 μm to 80 μm or 50 μm to 60 μm. For vertical devices, such as vertical transistor devices, it may be desirable to reduce the thickness of the semiconductor body to decrease or tailor the RDSon of the device. Thinner semiconductor dies may be more difficult to handle and may be more prone to damage, for example during embedding in a printed circuit board. The chip protection envelope according to tone of the embodiments described herein may be used to increase the robustness of these thin semiconductor dies during handling and, for example, embedding in a printed circuit board.

The semiconductor die may include a chip metallisation arranged on the semiconductor body. This metallisation may have a thickness of 3 μm to 20 μm or 3 μm to 10 μm. The conductive material of the chip protection envelope is applied to the semiconductor and may increase the thickness of the metallization by at least 10 μm. The total metal thickness $t_2$ may lie in the range of 15 μm to 70 μm or 20 μm to 50 μm. If the semiconductor die includes a vertical device, such as a vertical diode or a vertical transistor device, each of the two opposing surfaces of the semiconductor die includes metallisation. The total metal thickness on each of the two opposing surfaces may lie in the range of 15 μm to 70 μm or 20 μm to 50 μm.

A vertical transistor device may include two electrodes on a first surface, for example a gate electrode and a current electrode, and a further electrode, for example a second current electrode, on a second surface opposing the first surface. For a MOSFET device, a gate electrode and a source electrode may be arranged on the first surface and a drain electrode on the second surface. The drain electrode may extend over nearly the entire second surface. The source electrode may extend over the majority of the first surface with the gate electrode having a smaller lateral area. The second dielectric layer may extend onto the first surface such that it includes two discrete openings, one bounding a central portion of the gate electrode and a second opening bounding a central portion of the source electrode. The third dielectric layer may extend onto the second surface and bound a central portion of the drain electrode.

In some embodiments, the chip protection envelope further includes a seed layer arranged on side faces and a base of at least one discrete opening extending through the second dielectric layer. The seed layer may also extend onto the outermost surfaces of the second dielectric layer. The seed layer is conductive and may include a metal or alloy, for example copper, and may be deposited using electroless plating. One or more conductive layers may be deposited on the seed layer using electroless plating or electroplating. Electroplating techniques tend to have a faster deposition rate than electroless plating techniques.

Electroless plating is also known as chemical or autocatalytic plating and describes a non-galvanic plating method that includes simultaneous reactions in an aqueous solution which occur without the use of external electrical power so that a layer is deposited on a substrate which is in contact with the solution. Electroplating differs from electroless plating in that an external electrical power source is used.

The chip protection envelope 20 may be fabricated by embedding semiconductor die 22 in the first dielectric layer 21, applying the second dielectric layer 23 to the first surface 25 of the first dielectric layer 21, forming at least one opening 28 in the second dielectric layer 23, whereby at least one opening 28 is arranged on the semiconductor die 22 and applying a conductive material into the opening 28. In embodiments in which the second dielectric layer 23 includes a photodefinable polymer composition, the method further includes at least partially curing the second dielectric layer by applying electromagnetic radiation. In some embodiments, the electromagnetic radiation may be UV light.

In some embodiments, the second dielectric layer 23 includes a polymer composition having a portion which is cured by applying electromagnetic radiation and a portion which is cured by applying heat, i.e. is thermally cured. These photodefinable polymer compositions may be partially cured and/or structured by applying electromagnetic radiation and subsequently subjected to a thermal cure to fully or substantially fully cure the second dielectric layer 23.

In some embodiments, a third dialectic layer is applied to the second dielectric layer 23 before application of the conductive material. The third dielectric layer may include a photodefinable polymer, such as an epoxy resin. In these embodiments, the third dielectric layer may be structured at the same time as the second dielectric layer 23 to provide the at least one opening 28.

When cured, polyimide is highly chemical resistant. To prepare a polyimide layer for subsequent, adhesive or metallization stages, an extra layer of material that can be chemically activated without damaging the polyimide passivation may be applied. A material such as a photo definable epoxy resin would be very suitable for this application. The surface of this material may be prepared for metallization and to assist the surface adhesion properties. The material can be applied to both surfaces simultaneously and can be exposed, developed and cured in a similar way to the passivation.

The conductive material may be applied into the opening 28 such that it has at a surface substantially coplanar with the outer surface of the dielectric layer. In these embodiments, a further conductive layer may be applied which extends over the surface of the second dielectric layer 23 and the conductive material. This further conductive layer may be structured to provide discrete areas which are coupled to one or more contact pads on the semiconductor die 22. In some embodiments, the conductive material and further conductive layer may be provided by a single conductive layer which extends into the opening or openings and over the major surface of the dielectric layer.

If a seed layer is applied, it may be applied as a continuous layer which extends between the discrete conductive areas of the structured conductive layer 24. The seed layer may be removed in these areas by applying a resist to protect the contact pads and wet etching, for example.

The first dielectric layer 21 may include a prefabricated material such as core layer of a printed circuit board material or a B-stage pre-preg layer. In these embodiments, apertures may be formed in the first dielectric layer 21 in which the semiconductor die 22 is placed. The aperture may extend through the thickness of the first dielectric layer 21. In these embodiments, a temporary base for the aperture may be provided by placing a support onto the second major surface of the first dielectric layer 21. The semiconductor die 22 may be placed on the support within the aperture and the second dielectric layer 23 applied such that it extends from the first dielectric layer 21 over a gap between side faces of the aperture and the side faces of semiconductor die 22 to the semiconductor die 22, thus securing the semiconductor die 22 in the first dielectric layer 21. The support may then be removed and a further dielectric layer applied to the second major surface of the first dielectric layer 21 to secure the semiconductor die 22 within the aperture.

The second dielectric layer 23 and the conductive layer 24 may be arranged on a single major surface 25 of the first dielectric layer 21. However, in some embodiments, the second dielectric layer 23 and the conductive layer 24 are also arranged on the opposing second major surface of the first dielectric layer 21.

The semiconductor die 22 may include a lateral device and may include contact pads on only a single major surface. In some embodiments, the semiconductor die 22 includes a device having a vertical drift path and contacts on the two opposing surfaces of the semiconductor die 22. Examples of devices having a vertical drift path are a diode and a vertical transistor device.

In some embodiments, the thickness of the semiconductor die 22 may be substantially the same as the thickness of the first dielectric layer 21 so that the first major surface of the semiconductor die 22 is substantially coplanar with first major surface 25 of the first dielectric layer 21 and the second major surface of the semiconductor die 22 is substantially coplanar with the second major surface of the first dielectric layer 21. In these embodiments, at least one additional dielectric layer and at least one conductive layer are arranged on both first major surface and second major surface of the first dielectric layer. In these embodiments, the chip protection envelope includes contact areas on both opposing major surfaces of the chip protection envelope.

Figure 2:
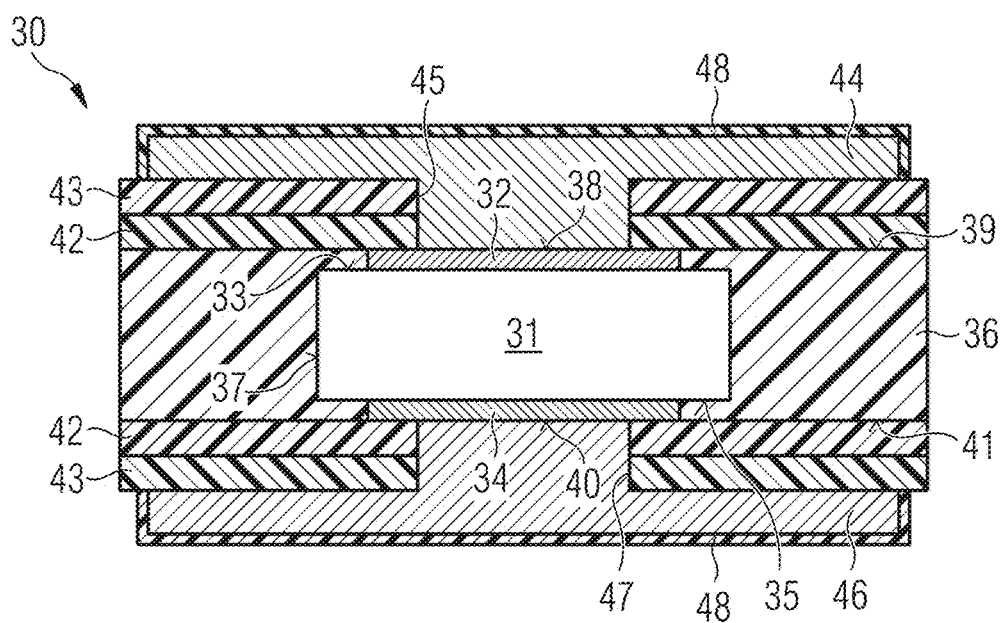
FIG. 2 illustrates a chip protection envelope according to a second embodiment.

FIG. 2 illustrates a chip protection envelope 30 according to a second embodiment. The chip protection envelope 30 includes a semiconductor die 31 including one or more contact pads 32 on a first major surface 33 and one or more contacts pads 34 on a second major surface 35 which opposes the first major surface 33. The semiconductor die 31 may include a vertical semiconductor device such as a diode or a transistor which has a vertical drift path. The semiconductor die 31 is arranged in a first dielectric layer 36. The first dielectric layer may include a polymer such as polyimide. In some embodiments, the first dielectric layer 36 may include a composite including a filler and a matrix, such as a woven glass fibre filler impregnated with epoxy resin providing the matrix. As an example, the first dielectric layer 36 may include FR4.

The side faces 37 of the semiconductor die 31 may be in direct contact with the material forming the first dielectric layer 36. In other embodiments, the semiconductor die 31 is placed in an aperture provided in a preformed first dielectric layer 36 such that there is a small gap between side faces 37 of the semiconductor die 31 and the material of the first dielectric layer 36.

The height of the semiconductor die 31 may be substantially same as the thickness of the first dielectric layer 36 such that an outermost surface 38 of the first contact pad 32 is substantially coplanar with a first major surface 39 of the first dielectric layer 36 and an outermost surface 40 of the second contact pad 34 is substantially coplanar with a second major surface 41 of the first dielectric layer 36. However, the relationship between the thickness of the semiconductor die 31 and the first dielectric layer 36 may vary. For example, in some embodiments, the thickness of the semiconductor body of the semiconductor die 31 may be substantially the same as the thickness of first dielectric layer 36 such that the first major surface 33 of the semiconductor die 31 is substantially coplanar with first major surface 39 of the first dielectric layer 36 and the second major surface 35 of the semiconductor die 31 is substantially coplanar with the second major surface 41 of the first dielectric layer 36.

The chip protection envelope 30 includes two dielectric layers 42, 43 which are arranged on both the first major surface 39 and the second major surface 41 of the first dielectric layer 36. The second dielectric layer 42 is arranged directly on the first major surface 39 of the first dielectric layer 36 and first major surface 38 of the semiconductor die 31. The first dielectric layer 42 may have a composition which is selected to provide good passivation for the underlying material of first dielectric layer 36 and the semiconductor die 31. The third dielectric layer 43 is arranged on the second dielectric layer 42 and may include material which has good adhesion promoting properties to metals.

The lateral extent of the second dielectric layer 42 and the third dielectric layer 43 may be substantially the same. The second dielectric layer 42 and the third dielectric layer 43 may extend onto the surfaces of the semiconductor die 31 and may partially overlap the peripheral regions of the contact pads 32, 34. This arrangement of the second dielectric layer 42 and third dielectric layer 43 may be used to secure semiconductor die 31 in an aperture in the first dielectric layer 36 or to assist in securing semiconductor die 31 within the first dielectric layer 36.

The second dielectric layer 42 may have a thickness of 5 μm to 20 μm on each major surface 39, 41 of the first dielectric layer 36. The third dielectric layer may have a thickness of 10 μm to 70 μm on each major surface 39, 41 of the first electric layer 36.

The chip protection envelope 30 further includes a conductive layer 44 which is arranged on the third dielectric layer 43 on the first major surface 33 of the first dielectric layer 36. The conductive layer 44 is also arranged in an opening 45 in the second dielectric layer 42 and the third dielectric layer 43 which has a base formed by a central region of the first contact pad 32. Similarly, on the opposing side of the first dielectric layer 36, a conductive layer 46 is arranged in an opening 47 in the second dielectric layer 42 and the third dielectric layer 43 which has a base formed by a central region of the second contact pad 34.

The conductive layers 44, 46 have a lateral extent which is larger than the lateral extent of the respective contact pads 32, 34. The conductive layers 44, 46 are arranged on the respective contact pad 32, 34 and on the third dielectric layer 43 in regions adjacent the contact pad 32, 34. Consequently, the dielectric layers 36, 42, 43 provide a support structure for fan-out type redistribution conductive redistribution structure for the chip protection envelope 30.

In the embodiment illustrated in FIG. 2, the chip protection envelope 30 further includes an electrically nonconductive layer 48 which covers the outermost surfaces of the conductive layers 44, 46. The electrically nonconductive layer 48 may provide corrosion protection for the underlying material of the conductive layers 44, 46.

The second dielectric layer 42 and the third dielectric layer 43 may include a photodefinable polymer composition so that the openings 45, 47 may be formed by photoimaging techniques. The openings 45, 47 may be formed through both dielectric layers 42, 43 using a single resist and curing process. Both the second dielectric layer 42 and the third dielectric layer 43 may include photodefinable polyimide, for example. In some embodiments, the second dielectric layer 42 includes a photodefinable polyimide and the third dielectric layer 43 includes a photodefinable epoxy resin. The conductive layers 44, 46 may include copper. The outermost electrically nonconductive layer 48 may include an organic material, such as polyimide, an epoxy or parylene.

The chip protection envelope 30 may have outer dimensions and an outer contour which is suitable for embedding within a printed circuit board. For example, the overall height of the chip protection envelope 30 may correspond to the thickness of a standard core layer used in printed circuit board manufacture. The thickness of the one or more deposited dielectric layers 42, 43 and/or the first dielectric layer 36 and/or the conductive layer 44 may be adjusted depending on the thickness of the semiconductor die 31 so that the chip protection envelope 30 has a predetermined thickness.

The arrangement of the first dielectric layer 36, second dielectric layer 42 and third dielectric layer 43 around the side faces 37 and edges of the semiconductor die 31 provides mechanical protection for the semiconductor die 31 during handling processes, such as pick and place, which may be used to position the chip protection envelope 30 within layers of the printed circuit board. The second dielectric layer 42, third dielectric layer 43 and conductive layer 44 also provide protection for the semiconductor die 31 during a lamination process, during which the chip protection envelope 30 is embedded within a dielectric layer of the printed circuit board.

The conductive layers 44, 46 increase the thickness of the metal arranged directly above semiconductor die 31. The conductive layers 44, 46 also provide a thicker metal layer than the thickness of the contact pads 32, 34 arranged on the semiconductor die 31. For example, each of the conductive layers 44, 46 may have a thickness of at least 5 μm, for example 10 μm to 70 μm in regions positioned on the third dielectric layer 43. The conductive layers 44, 46 may be used for electrically coupling the chip protection envelope 30 and, therefore, the semiconductor die 31 to the conductive redistribution structure of the printed circuit board using printed circuit board manufacturing techniques such as via drilling and via plating. The thickness of the conducive layers 44, 46 may be used to enable the use of techniques such as depth drilling in which a portion of the conductive layer at the drill tip is removed by the drilling process and by a subsequent cleaning process By increasing the thickness of the conductive layers 44, 46, the remaining portion of the layer at the base of the via has a clean surface such that a good electrical contact can be formed with conductive material inserted into the via to produce the conductive via 44.

The manufacture of a chip protection envelope will now be described in connection with FIGS. 3 to 8. The manufacturing processes are typically carried out on a panel with a large number of envelope positions, for example hundreds or thousands of envelope positions. For the purposes of illustration, in FIGS. 3 to 8, a panel with four envelope positions is illustrated in the perspective top view and perspective bottom view and the cross-sectional views illustrate a single component position.

FIG. 3a illustrates a perspective top view and FIG. 3b a cross-sectional view of a core layer 50 of a chip protection envelope. The core layer 50 includes woven glass fibres impregnated with an epoxy resin and provides a first dielectric layer for the chip protection envelope. The core layer 50 may include FR4, for example. The core layer 50 includes a plurality of apertures 51 each extending through the thickness of the core layer 50 and each having a lateral size and shape for accommodating a semiconductor die.

FIG. 4a illustrates a perspective top view and FIG. 4b a cross-sectional view of a semiconductor die 52 inserted in an aperture 51 of the core layer 50. The semiconductor die 52 may include a transistor device. The semiconductor die 52 has a metallisation structure on two opposing major surfaces and an overall height which corresponds to the thickness of the core layer 50 such that the upper surface 53 of the upper surface metallisation 54 is substantially coplanar with an upper surface 55 of the core layer 50 and a lower surface 56 of the lower surface metallisation 57 is substantially coplanar with a lower surface 58 of the core layer 50.

The semiconductor die 52 has lateral dimensions which are slightly smaller than the lateral dimensions of the aperture 51 such that there is a gap 59 between the side faces 60 of the core layer 50 defining the aperture 51 and the side faces 61 of the semiconductor die 52. This gap 59 enables the semiconductor die 52 to be placed in the aperture 51 formed in a prefabricated core layer 50 by pick and place techniques, for example. The aperture 51 includes a base 62 provided by a temporary support or carrier 63 which is applied to the lower surface 58 of the core layer 50. The carrier 63 is used to temporarily support and position semiconductor die 52 within the aperture 51.

FIG. 5a illustrates a perspective top view, FIG. 5b a perspective bottom view and FIG. 5c a cross-sectional view of a dielectric layer 64 applied to the semiconductor die 52 and the core layer 50. The dielectric layer 64 is arranged on both the upper surface 55 and the lower surface 58 of the core layer 50. In this particular embodiment, the dielectric layer 64 includes two sublayers 65, 66. A first sublayer 65 is arranged directly on the upper surface 55 and lower surface 58 of the core layer 50 and the second sublayer 66 is arranged on the first sublayer 65 on both sides of the core layer 50. One or both of the sublayers 65, 66 of the dielectric layer may be applied using a printing technique, for example.

The first sublayer 65 and second sublayer 66 may have differing compositions which may be selected to tune properties of each of the sublayers. In an embodiment, the first sublayer 65 includes a photoimagable polyimide and is used as passivation layer. The second sublayer 66 includes a photoimagable epoxy resin which is used to promote adhesion to an overlying metallic layer.

The dielectric layer 64 extends from the upper surface 55 of the core layer 50 over the gap 59 between the side faces 60 the aperture 51 and the side faces 61 of the semiconductor die 52 onto the upper surface 53 of the upper metallization 54 of the semiconductor die 52. Similarly, on the opposing side, the dielectric layer 64 extends from the lower surface 58 of the core layer 50 over the gap 59 onto the lower surface 56 of the lower metallization 57 of the semiconductor die 52. In this embodiment, the dielectric layer 64 is used to secure the position of the semiconductor die 52 within the aperture 51.

The dielectric layer 64 may penetrate into the gap 59 and be in direct contact with the side faces 61 of semiconductor die 52 and side faces 60 of the aperture to assist in securing the position semiconductor die 52 within the aperture 51. In embodiments in which the core layer 50 is thicker, an additional member may be arranged between the side faces 61 of the semiconductor die 52 and side faces 60 of the aperture 51 to assist in securing the semiconductor die 52 within the aperture 51.

In the embodiment illustrated in FIGS. 3 to 8, the semiconductor die 52 includes a vertical transistor device including a gate pad 67 and source pad 68 on the upper side and a drain pad 69 on the lower side. The dielectric layer 64 includes discrete openings 70 formed above the gate pad 67, the source pad 68 and the drain pad 69.

Figure 6A:
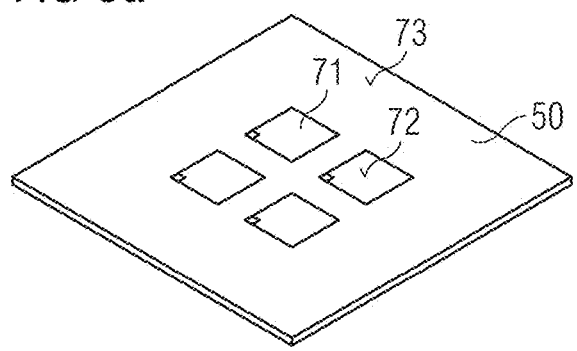
FIG. 6a illustrates a perspective top view of a first conductive layer applied to the semiconductor die.
Figure 6B:
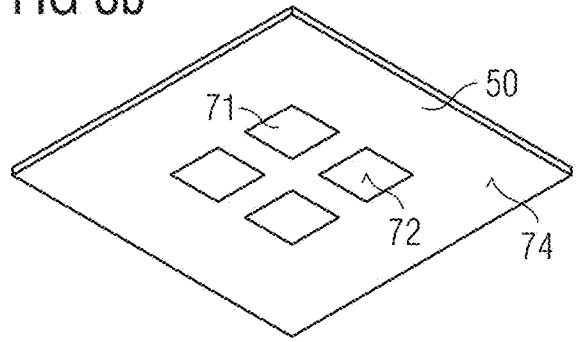
FIG. 6b illustrates a perspective bottom view of the first conductive layer applied to the semiconductor die.
Figure 6C:
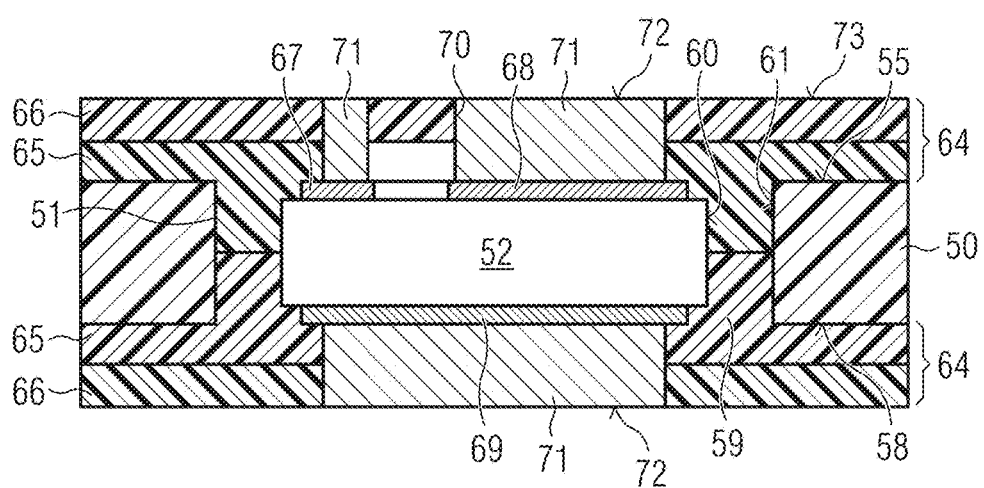
FIG. 6c illustrates a cross-sectional view of the first conductive layer applied to the semiconductor die.

FIG. 6a illustrates a perspective top view, FIG. 6b a perspective bottom view and FIG. 6c a cross-sectional view of a first conductive layer 71 applied to the semiconductor die 52. In particular, the first conductive layer 71 is applied into the openings 70 positioned in the dielectric layer 64 such that portions of the conductive layer 71 are electrically coupled to the gate pad 67, the source pad 68 and drain pad 69. The outer surface 72 of the first conductive layer 71 is substantially coplanar with the outer surfaces 73, 74 of the dielectric layer 64 such that discrete conductive areas are formed which are electrically isolated from one another by regions of the dielectric layer 64. The conductive material 71 may include a metal such as copper, or an alloy.

The conductive material 71 positioned in the openings 70 may be used to increase the thickness of the metal positioned on the semiconductor die 52. This increased metal thickness is useful for improving the robustness and carrying current carrying capabilities of the semiconductor device.

The first conductive layer 71 may be applied by electroless plating. In some embodiments, a seed layer is first deposited which covers the outer surfaces 73, 74 of the dielectric layer 64, side faces defining the openings 70 and the exposed surfaces of the gate pad 67, source pad 68 and drain pad 69. Since the seed layer provides a continuous conductive path, it can be used to as an electrode onto which the first conductive layer 71 may be deposited using electroplating techniques.

FIG. 7a illustrates a perspective top view, FIG. 7b a perspective bottom view and FIG. 7c a cross-sectional view of a second conductive layer 75 applied to the semiconductor die 52, the first conductive layer 71 and the dielectric layer 64. The second conductive layer 75 extends over the dielectric layer 64 in regions above the core layer 50 and has a lateral extent which is greater than the lateral extent of the first conductive layer 71 and the lateral extent of the gate pad 67, source pad 68 and drain pad 69. In embodiments, in which the first and second conductive layers 71, 75 are deposited by electroplating, they may be considered as a single layer.

The second conductive layer 75 may be subsequently structured to define the contact pads on the outermost surfaces of the chip protection envelope. Consequently, the combination of the core layer 50 and the dielectric layer 64 provides a support structure for increasing the lateral area of the contact pads of the semiconductor die 52. The core layer 50 may then be singulated, for example by sawing, to produce a plurality of chip protection envelopes 76.

Figure 7D:
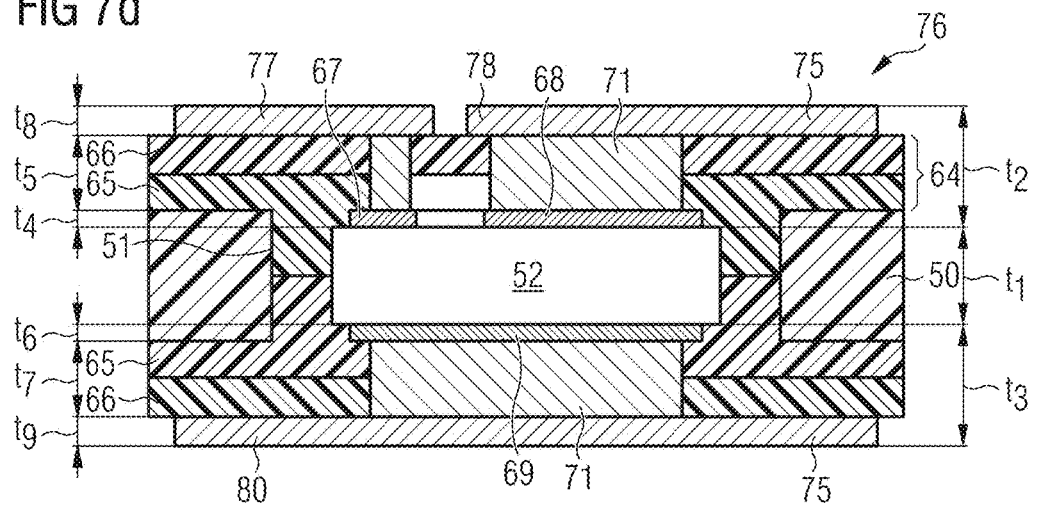
FIG. 7d illustrates a partial cross-sectional view of FIG. 7c in which thicknesses of the semiconductor die, dielectric layers and conductive layers are illustrated.

FIG. 7d illustrates a partial cross-sectional view in which thickness are illustrated. The semiconductor die 52 has a thickness $t_1$. The source pad 68 has a thickness $t_4$, the first conductive layer 71 has a thickness $t_5$ and the second conductive layer 75 has a thickness $t_8$. The total thickness of the conductive material on the upper surface of the semiconductor die 52 is, therefore, the sum of $t_4$, $t_5$ and $t_8$. This total thickness may be at least one third of the thickness $t_1$ of the semiconductor die 52 so that $(t_4+t_5+t_8) \geq t_1/3$. The sum of the thickness of the source pad 68 and first conductive layer 71 may be around one half of the total thickness so that $(t_4+t_5) \geq t_1/6$.

Similarly, on the rear surface of the semiconductor die 22, the drain pad 69 has a thickness $t_6$, the first conductive layer 71 has a thickness $t_7$ and the second conductive layer 75 has a thickness $t_9$. The total thickness of the conductive material on rear surface of the semiconductor die 52 is, therefore, the sum of $t_6$, $t_7$ and $t_9$. This total thickness may be at least one third of the thickness of the semiconductor die 52 so that $(t_6+t_7+t_9)\ t_1/3$. The sum of the thickness of the drain pad 69 and first conductive layer 71 may be around one half of the total thickness so that $(t_6+t_7)\ t_1/6$. The gate pad 67 may have a thickness which is less than the thickness of the source pad 68 and the drain pad 69.

The thickness $t_1$ of the semiconductor die may lie in the range of 40 μm to 100 μm, 40 μm to 80 μm or 50 μm to 60 μm.

The chip metallisation of the source pad 68 and drain pad 69 arranged on the semiconductor body may have a thickness of $t_4$ or $t_6$, respectively, within the range 3 μm to 20 μm or 3 μm to 10 μm.

The conductive material applied to the semiconductor die 52 may increase the thickness $t_5$ or $t_7$ of the metallization by at least 10 μm.

The thickness $t_8$ and $t_9$ of the conductive layer 75 in regions arranged on the dielectric layer each lie within the range of 5 μm to 70 μm or 10 μm to 50 μm.

The total metal thickness $t_2$, $t_3$ of the conductive material arranged above the semiconductor die 52 may lie in the range of 15 μm to 70 μm or 20 μm 50 μm.

The thickness of the conductive layers $t_4$, $t_5$ and $t_8$ on the upper surface of the semiconductor die 52 may be the same or may differ from the thickness of the conductive layers $t_6$, $t_7$ and $t_9$ on the rear surface of the semiconductor die 52. Any difference in the thickness may result from the electroplating process in which deposition onto surfaces facing an electrode of the galvanic cell or in closer proximity to an electrode of the galvanic cell may be faster, resulting in a greater thickness, than deposition onto surfaces opposing an electrode of the galvanic cell or arranged at a greater distance form an electrode of the galvanic cell.

Figure 8A:
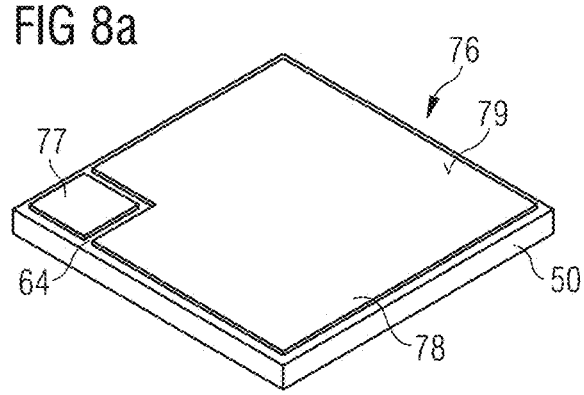
FIG. 8a illustrates a perspective top view of a singulated chip protection envelope.
Figure 8B:
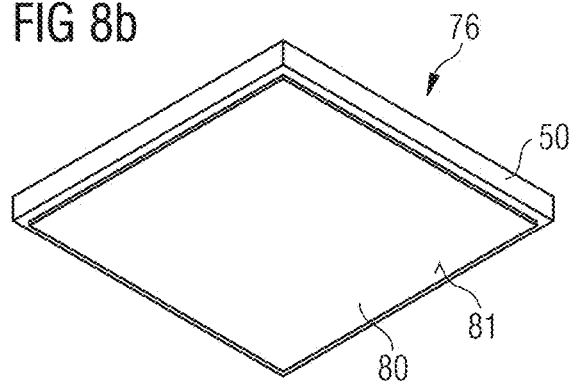
FIG. 8b illustrates a perspective bottom view of a singulated chip protection envelope.

FIG. 8a illustrates a perspective top view and FIG. 8b a perspective bottom view of a singulated chip protection envelope 76. The chip protection envelope 76 includes a gate contact pad 77 which may be arranged in corner of the upper surface 79 and a source contact pad 78 which extends over the majority of the upper surface 79 of the chip protection envelope 76. The chip protection envelope 76 also includes a drain pad 80 which extends over the majority of the lower surface 81 of the chip protection envelope 76. The contact pads 77, 78 and 80 protrude above the outer surfaces 73, 74 of the dielectric layer 64.

Figure 9:
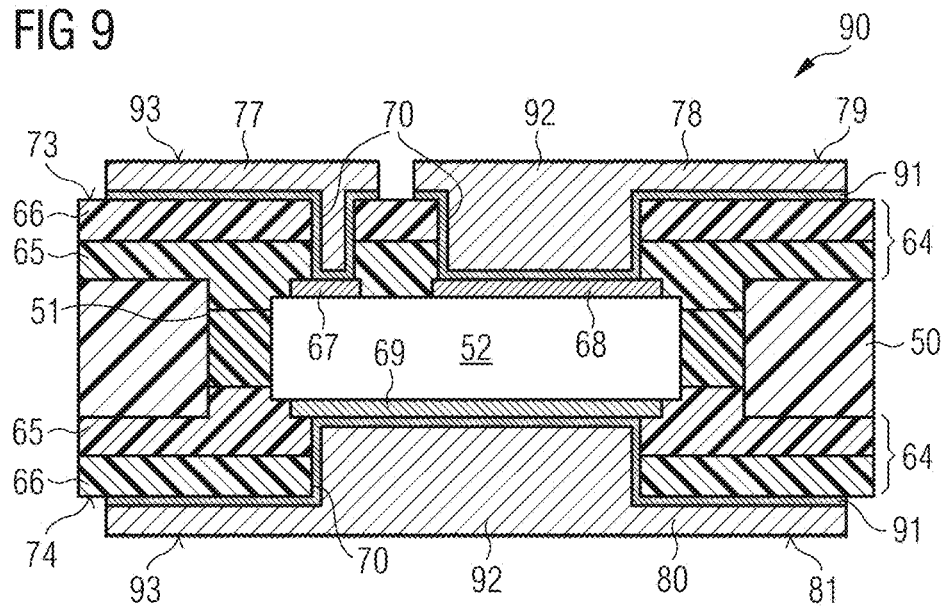
FIG. 9 illustrates a cross-sectional view of a chip protection envelope according to a third embodiment.

FIG. 9 illustrates a cross-sectional view of a chip protection envelope 90. The chip protection envelope 90 includes a core layer 50, a semiconductor die 52 positioned in an aperture 51 in the core layer 50 and a dielectric layer 64 arranged on the core layer 50 and the semiconductor die 52 as in the chip protection envelope 76 illustrated in FIGS. 7 and 8.

The chip protection envelope 90 includes a seed layer 91 which extends over the surfaces 73, 74 of dielectric layer 64, side faces of the openings 70 and exposed regions of the gate pad 67, source pad 68 and drain pad 69 of the semiconductor die 51. The chip protection envelope 90 includes a single conductive layer 92 which extends in the openings 70 of the dielectric layer 64 and on regions of the outermost surfaces 73, 74 of the dielectric layer 64. The seed layer 91 and conductive layer 92 are patterned or structured to provide a separate gate pad 77 and source pad 78 on the upper surface 79 and a drain pad 80 on the lower surface 81.

The chip protection envelope 90 has been further processed in order to produce a roughened surface 93 on the conductive layer 92. This roughened outermost surface 93 is non-contactable and is provided to assist in promoting mechanical anchoring between the chip protection envelope 90 and further dielectric layers of the printed circuit board which are applied to the chip protection envelope 90 to embed the chip protection envelope 90 within the printed circuit board.

An example of a process flow for manufacturing chip protection envelopes is as follows:
  adhere a core layer including a plurality of apertures to a carrier tape;
    place semiconductor dies into the apertures;
    deposit a first passivation, for example polyimide, on a first surface of the assembly;
    dry the first passivation;
    expose and develop the first passivation;
    release the core layer from the carrier tape;
    deposit a second passivation on a second surface of the assembly;
    dry the second passivation;
    expose and develop the second passivation;
    cure or semi-cure both the first and second passivation;
    deposit an organic, such as epoxy, on both sides of the assembly substantially simultaneously;
    dry the organic;
    expose and develop the organic;
    cure the organic;
    prepare the semiconductor die metallization and organic for plating;
    deposit a seed layer on both surfaces substantially simultaneously by electroless plating;
    deposit plating resist on both surfaces substantially simultaneously;
    expose and develop the plating resist;
    electrolytically plate both surfaces simultaneously to deposit a conductive layer of metal, such as copper;
    etch unwanted metal to produce an outer redistribution structure including pads;
  singulate the envelopes from the assembly, and
  test and package the envelopes for transport.

Figure 10:
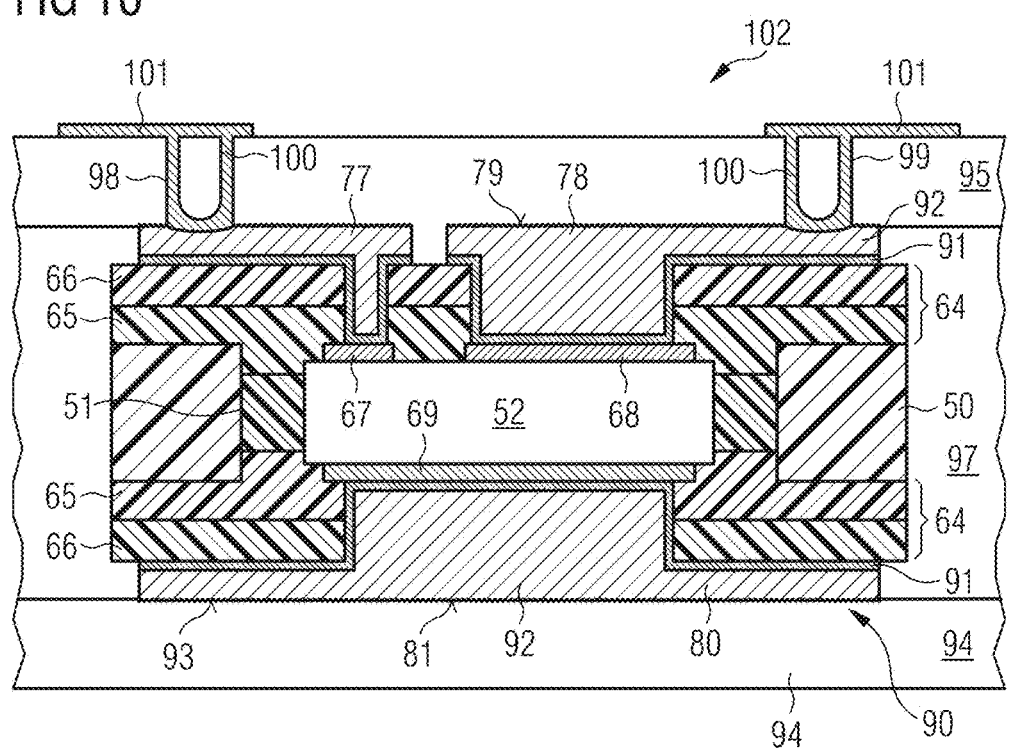
FIG. 10 illustrates a cross-sectional view of a chip protection envelope embedded in a printed circuit board.

FIG. 10 illustrates the chip protection envelope 90 embedded in a printed circuit board. The chip protection envelope 90 may be mounted in an aperture 96 of a core layer 97 of a printed circuit board. A first dielectric layer 94 is arranged on the lower surface 81 and a second dielectric layer 95 is arranged on the upper surface 79 of the chip protection envelope 90. Further conductive layers and dielectric layers may be added on one or more both sides of this structure depending on the number of layers required in the multi-layered printed circuit board. The dielectric layers 94, 95, 97 are laminated together using a combination of pressure and heat. The roughened surface 93 of the conductive layer 92 of the chip protection envelope 90 may be used to increase the mechanical adhesion between the chip protection envelope 90 and the neighbouring dielectric layers 94, 95 during and after the lamination process. The structure of the chip protection envelope 90 protects the semiconductor die 52 during this lamination process.

In order to provide electrical coupling to the chip protection envelope 90, which is now embedded within the printed circuit board, vias 98, 99 may be inserted through the dielectric layers 94, 95 by laser drilling or mechanical drilling for example. The vias 98, 99 may be positioned so that they are above the core layer 50 of the chip protection envelope 90 and adjacent to the semiconductor die 52. Due to the increased thickness of the conductive layer 92 in regions adjacent the semiconductor die 52, some of the material including the roughened surface 93 may be removed during the drilling process and subsequent chemical cleaning to provide a clean surface. The prepared surface may be used to produce an improved electrical connection between conductive material 100 inserted into the vias 98, 99 and the underlying portion of the conductive layer 92. The conductive material 100 electrically couples the chip protection envelope to the conductive redistribution structure 101 of the printed circuit board 102. The redistribution structure may include patterned copper foil arranged on or between dielectric layers.

The thickness of the chip protection envelope 90 may be selected such that it corresponds to the thickness of the core layer 97 of the printed circuit board. In other embodiments, the thickness of the semiconductor die 52 within the core layer 50 may differ such that the combination of the thickness of the core layer 50 of the chip protection envelope 90, the dielectric layer 64 and conductive layer 92 is used to compensate for variations in the thickness of the semiconductor die 52 such that the outer dimensions of the chip protection envelope conform to a predetermined standard thickness.

In the embodiments described in connection with the figures, each chip protection envelope includes a single die. However, the chip protection envelope is not limited to including a single semiconductor die and may include two or more semiconductor dies. The two or more semiconductor dies may be electrically coupled together to provide a desired circuit or part of a circuit. For example, the envelope may include two transistor devices coupled in a half-bridge configuration. These embodiments may also be called a system in envelope. The circuit or part circuit and/or the individual semiconductor dies may be tested before lamination into a higher level circuit board.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A chip protection envelope, comprising:
   a first dielectric layer comprising at least one organic component comprising a decomposition temperature of at least 180° C.;
   a semiconductor die embedded in the first dielectric layer, the semiconductor die having a first surface and a thickness t1;
   a second dielectric layer arranged on a first surface of the first dielectric layer, the second dielectric layer comprising a photodefinable polymer composition;
   a first conductive layer arranged on the first surface of the semiconductor die and electrically coupled to the semiconductor die, the conductive first layer comprising a thickness t2, wherein $t2 \geq t1/3$, wherein the first conductive layer forms a first contact pad;
   a third dielectric layer arranged on a second surface of the first dielectric layer, the second surface opposing the first surface of the first dielectric layer, wherein the third dielectric layer comprises a photodefinable polymer composition; and
   a second conductive layer arranged on a second surface of the semiconductor die opposite the first surface of the semiconductor die and electrically coupled to the semiconductor die, wherein the second conductive layer has a thickness t3, wherein $t3 \leq t1/3$, and the second conductive layer forms a second contact pad.

2. The envelope according to claim 1, wherein the second dielectric layer extends from the first dielectric layer onto the semiconductor die.

3. The envelope according to claim 1, wherein the outermost surface of the second dielectric layer comprises an epoxy-based composite.

4. The envelope according to claim 1, wherein the first conductive layer extends from the semiconductor die onto the second dielectric layer.

5. The envelope according to claim 1, wherein a first electrode of the semiconductor die forms a base of a discrete opening extending through the second dielectric layer and the first conductive layer is arranged in the discrete opening.

6. The envelope according to claim 5, wherein a second electrode of the semiconductor die forms a base of an opening extending through the third dielectric layer and the second conductive layer is arranged in the discrete opening.

7. The envelope according to claim 1, wherein the third dielectric layer extends onto the second surface of the semiconductor die.

8. The envelope according to claim 1, wherein the second conductive layer extends onto the third dielectric layer.

9. The envelope according to claim 1, wherein the semiconductor die comprises a vertical transistor device.

10. The envelope according to claim 1, wherein $40\ \mu m \leq t1 \leq 100\ \mu m$ and $15\ \mu m \leq t2 \leq 70\ \mu M$.

11. The envelope according to claim 1, wherein the second dielectric layer comprises two or more sublayers of differing composition.

12. The envelope according to claim 11, wherein a second sublayer comprises a chemical affinity for copper that is greater than a chemical activity for copper of a first sublayer.

13. The envelope according to claim 12, wherein the first sublayer comprises a photodefinable polyimide and the second sublayer comprises a photodefinable epoxy-based composite.

14. The envelope according to claim 1, wherein the first conductive layer has a non-contactable surface.

15. The envelope according to claim 1, wherein the first conductive layer is covered by an electrically insulative layer.

16. A method, comprising:
embedding a semiconductor die in a first dielectric layer, the semiconductor die having a thickness t1 and the first dielectric layer comprising at least one organic component comprising a decomposition temperature of at least 180° C.;
applying a second dielectric layer to a first surface of the first dielectric layer and a first surface of the semiconductor die, the second dielectric layer comprising a photodefinable polymer composition;
forming at least one opening in the second dielectric layer, at least one opening in the second dielectric layer having a base formed by a first electrode of the semiconductor die, the first electrode having a thickness t4;
applying a conductive material into the at least one opening in the second dielectric layer to form a first contact pad over the first surface of the semiconductor die, the conductive material comprising a thickness t5, wherein (t4+t5)≥t1/6;
applying a third dielectric layer to a second surface of the first dielectric layer and a second surface of the semiconductor die, the third dielectric layer comprising a photodefinable polymer composition;
forming at least one opening in the third dielectric layer, the at least one opening in the third dielectric layer having a base formed by a second electrode of the semiconductor die, the second electrode having a thickness t6; and
applying the conductive material into the at least one opening in the third dielectric layer to form a second contact pad over the second surface of the semiconductor die, wherein the first surface of the semiconductor die is opposite the second surface of the semiconductor die, and the conductive material comprises a thickness t7, wherein (t6+t7)≥t1/6.

17. The method according to claim 16, further comprising applying a conductive layer to the conductive material and to the second dielectric layer.

18. The method according to claim 17, wherein the conductive layer has a thickness t8, wherein (t4+t5+t8)≥t1/3.

19. The method according to claim 18, further comprising applying an electrically non-conductive coating to the conductive layer.

20. The method according to claim 17, further comprising roughening a surface of the conductive layer.

21. The method according to claim 16, wherein the applying the conductive material comprises depositing a seed layer onto side faces of the at least one opening in the second dielectric layer and onto the second dielectric layer by electroless plating and applying a conductive layer onto the seed layer by electroplating.

22. The method according to claim 16, wherein the second dielectric layer is applied by printing.

23. A chip protection envelope, comprising:
means for embedding a semiconductor die;
means for passivating at least portions of a first surface of the semiconductor die and a second surface of the semiconductor die opposite the first surface;
means for promoting adhesion to a first conductive layer to the first surface of the semiconductor die to form a first contact pad and to a second conductive layer to the second surface of the semiconductor die to form a second contact pad; and
means for electrically coupling the first surface of the semiconductor die to the first conductive layer and the second surface of the semiconductor die to the second conductive layer, wherein the transistor device has a thickness t1, the first conductive layer has a thickness t2 on the first surface of the transistor device and the second conductive layer has a thickness t3 on the second surface of the transistor device, wherein t1/3≤t2≤1.5t1 and t1/3≤t3≤1.5t1.

24. A chip protection envelope, comprising:
a support layer comprising a polymer;
a transistor device embedded in the support layer;
a passivation layer arranged on the support layer and on at least portions of the transistor device, the passivation layer comprising a polymer, wherein the passivation layer is arranged on a first surface of the support layer, a second surface of the support layer, portions of a first surface of the transistor device and portions of a second surface of the transistor device;
a first conductive layer arranged on the passivation layer and electrically coupled to the transistor device, wherein a ratio of a lateral area of the transistor device to a lateral area of the chip protection envelope is 1:1.05 to 1:5, wherein the first conductive layer forms a first contact pad over the first surface of the transistor device; and
a second conductive layer is arranged on the second surface of the transistor device and the second surface of the passivation layer, the second conductive layer being electrically coupled to the transistor device, wherein the second conductive layer forms a second contact pad over the second surface of the transistor device, wherein the first surface of the transistor device is opposite the second surface of the transistor device.

25. The chip protection envelope according to claim 24, further comprising an adhesion promotion layer arranged on the passivation layer, the adhesion promotion layer comprising a chemical affinity for copper that is greater than a chemical activity for copper of the passivation layer, wherein the first conductive layer is arranged on the adhesion promotion layer.

26. The chip protection envelope according to claim 25, wherein the passivation layer comprises a polyimide and the adhesion promotion layer comprises an epoxy-based composite.

* * * * *